United States Patent [19]

Yamauchi et al.

[11] Patent Number: 5,465,076
[45] Date of Patent: Nov. 7, 1995

[54] PROGRAMMABLE DELAY LINE PROGRAMMABLE DELAY CIRCUIT AND DIGITAL CONTROLLED OSCILLATOR

[75] Inventors: Shigenori Yamauchi, Kariya; Takamoto Watanabe, Nagoya, both of Japan

[73] Assignee: Nippondenso Co., Ltd., Kariya, Japan

[21] Appl. No.: 111,488

[22] Filed: Aug. 25, 1993

Related U.S. Application Data

[63] Continuation-in-part of Ser. No. 956,955, Oct. 2, 1992, Pat. No. 5,331,294.

[30] Foreign Application Priority Data

Oct. 4, 1991 [JP] Japan ................... 3-258039
Aug. 26, 1992 [JP] Japan ................... 4-227492

[51] Int. Cl.$^6$ .................. H03B 28/00; H03K 5/14; H03K 5/159
[52] U.S. Cl. .................. 331/179; 331/34; 331/57; 331/74; 327/277; 327/279; 327/284; 327/286
[58] Field of Search .................. 331/1 A, 34, 45, 331/57, 177 R, 179, 74; 307/602, 603; 328/155; 327/237, 241, 276, 277, 279, 284, 286, 291, 299

[56] References Cited

U.S. PATENT DOCUMENTS

| | | | |
|---|---|---|---|
| 2,870,431 | 1/1959 | Babcock | 332/104 X |
| 4,016,511 | 4/1977 | Ramsey et al. | 307/603 X |
| 4,894,626 | 1/1990 | Kubinec | 307/603 X |
| 4,978,927 | 12/1990 | Hausman et al. | 331/57 |
| 5,013,944 | 5/1991 | Fischer et al. | 307/603 |
| 5,045,811 | 9/1991 | Lewis . | |
| 5,128,624 | 7/1992 | Hoshino et al. | 328/135 |
| 5,175,453 | 12/1992 | Chang et al. | 327/276 |
| 5,175,454 | 12/1992 | Murakami | 307/603 |
| 5,258,660 | 11/1993 | Nelson et al. | 307/603 X |
| 5,331,294 | 7/1994 | Watanabe et al. | 331/57 |

FOREIGN PATENT DOCUMENTS

| | | |
|---|---|---|
| 60-250712 | 12/1985 | Japan . |
| 61-125218 | 6/1986 | Japan . |
| 1117514 | 5/1989 | Japan . |
| 2296410 | 12/1990 | Japan . |

OTHER PUBLICATIONS

Copy of patent application U.S. Ser. No. 956,955 filed Oct. 2, 1992, (now U.S. Pat. No. 5,331,294), Primary Examiner—David Mis
Attorney, Agent, or Firm—Cushman, Darby & Cushman

[57] ABSTRACT

A programmable delay line comprises a plurality of delay stages connected in series, each of the delay stages including: a basic path for passing an input signal; a delay path for passing the input signal with a predetermined delay time; and a selector for selecting either the basic path or the delay path to pass the input signal in accordance with digital data externally inputted, wherein differences in times for passing the input signal through the basic path and through the delay path in the plurality delay stages are $UD \cdot 2^n$ (n=0, 1, 2 ...), UD being unit delay time. A programmable delay apparatus comprises: an oscillator and counter, which determine a coarse delay time in accordance with the upper bit data of control data, and a programmable delay line, which determines a fine delay time according to the lower bit data of the control data after the finish of the coarse delay time to obtain a total delay time. The counter provides a wide range of available delay times. The oscillator of the programmable delay apparatus can be controlled by a control signal. Addition of a feedback circuit for supplying the delay signal from the delay line as the control signal to the oscillator of the programmable delay apparatus provides a digital controlled oscillator.

17 Claims, 10 Drawing Sheets

PROGRAMMABLE DELAY LINE PROGRAMMABLE DELAY CIRCUIT AND DIGITAL CONTROLLED OSCILLATOR

This application is a Continuation in Part of U.S. patent application Ser. No. 07/956,955, filed Oct. 2, 1992, now U.S. Pat. No. 5,331,294.

BACKGROUND OF THE INVENTION

1. Field of the Invention

This invention relates to a programmable delay line for delaying an input signal for an interval controlled by a digital signal, a programmable delay circuit having the programmable delay line, and to a digital controlled oscillator having the programmable delay circuit.

2. Description of the Prior Art

A delay circuit for delaying an input signal for an interval controlled by a digital signal is known. For, example, Japanese patent publication No. 2-296410 discloses such a delay circuit. This prior art delay circuit comprises a plurality of inverter circuits connected in series and a data selector circuit. A signal to be delayed is inputted to a first stage of the inverter circuits. The data selector circuit supplies either output of the inverters selectively in accordance with a digital signal to supply an output signal.

However, in such a prior art delay circuit, because the delay time is controlled by selecting either output of the series-connected inverter circuits, the ability to increase the range of variation of the delay time is necessarily limited. That is, as the desired range of variation, increases, the number of delay circuits required increases, so that it is difficult to increase a range of variation of the delay time considerably.

A prior art oscillator including such a delay circuit has the same problem.

SUMMARY OF THE INVENTION

The present invention has been developed in order to remove the above-described drawbacks inherent in the conventional programmable delay line, programmable delay circuit, and digital controlled oscillator.

According to the present invention there is provided a programmable delay line comprising: a plurality of delay stages connected in series, each of the delay stages including: a basic path for passing an input signal; a delay path for passing the input signal with a predetermined delay time; a selector for selecting either the basic path or the delay path to pass the input signal in accordance with digital data externally inputted, wherein differences in times for passing the input signal through the basic path and through the delay path in each of delay stages are $UD \cdot 2^n$ ($n=0, 1, 2, 3 \ldots$), UD being a possible minimum time difference between the passing of the input signal through the basic path and through the delay path in each of the delay stages.

According to the present invention there is also provided a programmable delay apparatus comprising: an oscillator responsive to an input signal for generating oscillation pulses at a predetermined interval; a counter for counting the oscillation pulses and generating a detection signal when a count value of the counter reaches a predetermined value; a programmable delay line for delaying the detection signal for an interval less than the predetermined interval, the interval being controlled by digital data; and a control data supplying circuit for receiving the digital control data having a predetermined number of bits indicative of a delay time of the input signal, for supplying upper bits of the digital control data to the counter as the predetermined value, and for supplying lower bits of the digital control data to the programmable delay line as the digital data.

According to the present invention there is further provided a digital controlled oscillation apparatus comprising: an oscillator for generating oscillation pulses at a predetermined interval; a counter for counting the oscillation pulses and generating a detection signal when a count value thereof reaches a predetermined value; a programmable delay line for delaying the detection signal for an interval less than the predetermined interval, the interval being controlled by digital data; a control data supplying circuit for receiving the digital control data having a predetermined number of bits indicative of a delay time of the input signal, for supplying upper bits of the digital control data to the counter as the predetermined value, and for supplying lower bits of the digital control data to the programmable delay line as the digital data; and a feedback circuit for stopping an oscillation condition of the oscillator in response to the detection signal and for starting the oscillator when the delay pulse is outputted from the programmable delay line.

BRIEF DESCRIPTION OF THE DRAWINGS

The object and features of the present invention will become more readily apparent from the following detailed description and as illustrated in the following accompanying drawings.

and

Figure 13A:
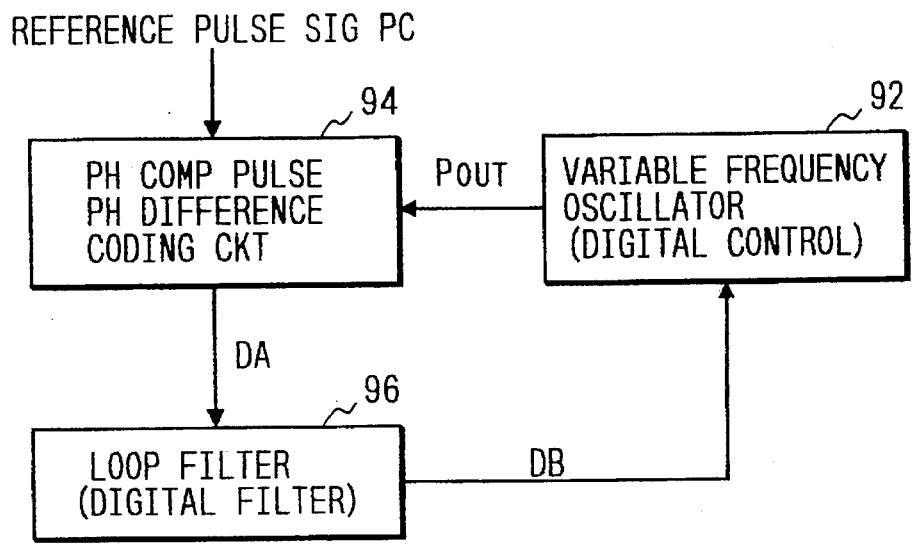
FIG. 13A shows an example of an application of the digital controlled oscillation apparatus of this embodiment.
Figure 13B:
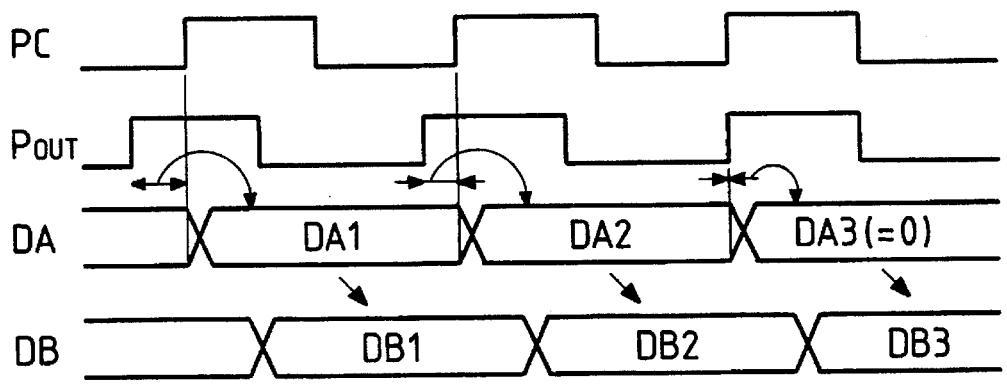

FIG. 13B is a time chart for showing an operation of this example of the digital PLL.

The same or corresponding elements or parts are designated as like references throughout the drawings.

DETAILED DESCRIPTION OF THE INVENTION

Figure 1:
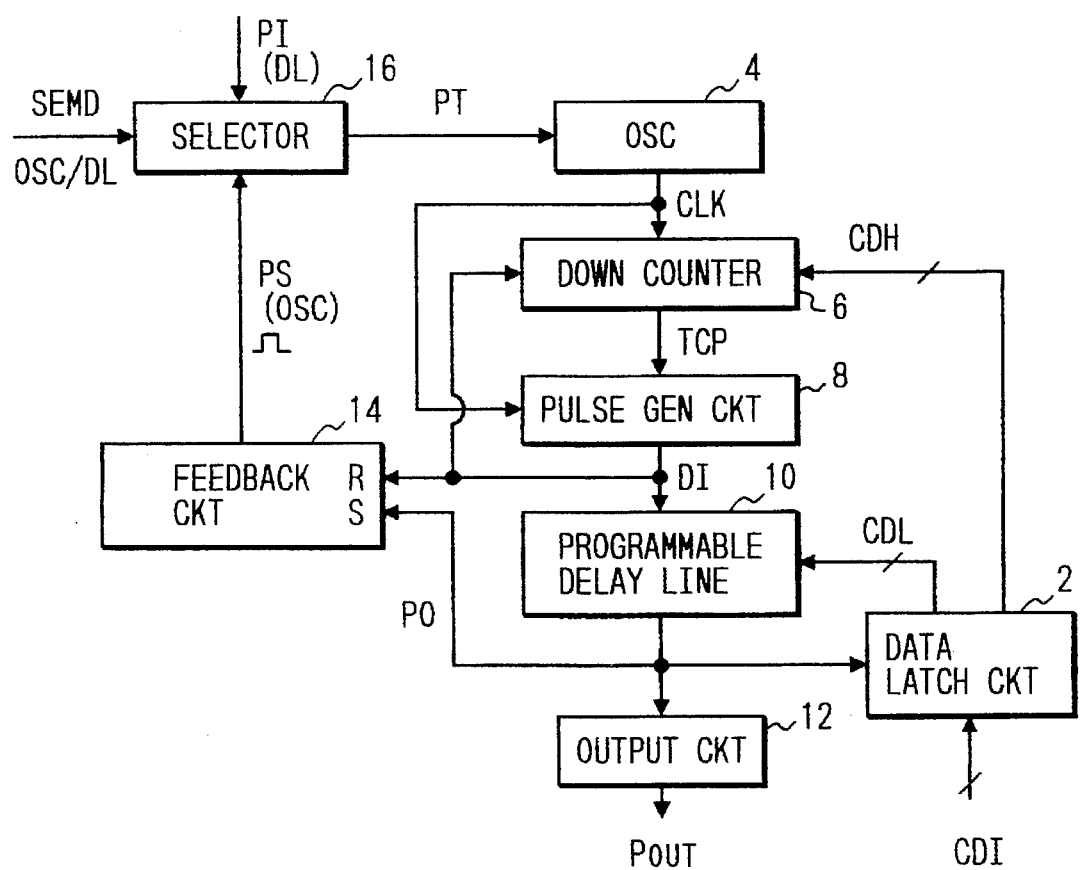
FIG. 1 is a block diagram of an embodiment of this invention for showing a digital controlled oscillation apparatus.

A first embodiment of this invention will be described below. FIG. 1 is a block diagram of the embodiment of this invention for showing a digital controlled oscillation apparatus.

This digital controlled oscillation apparatus comprises: a data latch circuit 2 for latching externally inputted, binary signal, digital control data CDI indicative of an output period of a pulse signal and for separately outputting the lower five bits of the digital control data and upper bits higher than five bits of the digital control data; an oscillator 4 for outputting an oscillation pulse with a predetermined time interval T when an externally inputted control pulse PT is in a logic H level; a down counter 6 for effecting down-counting in response to the oscillation pulses CLK and for outputting a detection signal TCP when the counted value corresponds to the upper bits of data CD[I outputted from the data latch circuit 2; a pulse generation circuit 8 for outputting a pulse signal DI in response to the oscillation pulse CLK when the detection signal TCP is outputted from the down counter; a programmable delay line 10 for delaying the pulse signal DI from the pulse generation circuit 8 for a delay time corresponding to the lower bit data CDL outputted from the data latch circuit 2; an output circuit 12 either for outputting the delayed pulse PO outputted from the programmable delay line 10 as is or for processing the delayed pulse PO and outputting the processed signal; a feedback circuit 14 responsive to the pulse signal DI outputted from the pulse signal generation circuit 8 and the delayed pulse PO outputted from the programmable delay line 10 for stopping the oscillation of the oscillator 4 when the pulse signal DI is inputted and for restarting the oscillation of the oscillator 4 when the delayed pulse PO is inputted; and a selector 16 for switching the condition of the whole circuit between oscillation and delay operations in response to a selection signal SEMD.

The feedback circuit 14 comprises an R-S flip flop circuit which is set upon the turning-on of the power supply to this circuit, and reset by the delayed pulse signal D, and set by the delayed pulse PO. This R-S flip flop circuit supplies a logic H level as an oscillation control signal PS to the oscillator 4 via the selector 16 when it is set.

The selector 16 comprises a multiplexer responsive to the selection signal SEMD for supplying the oscillation control signal PS from the feedback circuit 14 to the oscillator 4 as a control pulse PT when the selection signal SEMD is in a logic H indicating that this circuit is operated as an oscillator and for supplying the externally inputted reference pulse PI to the oscillator 4 as the control pulse PT when the selection signal SEMD is in a logic L level indicating that this circuit is operated as a delay circuit.

Figure 2A:
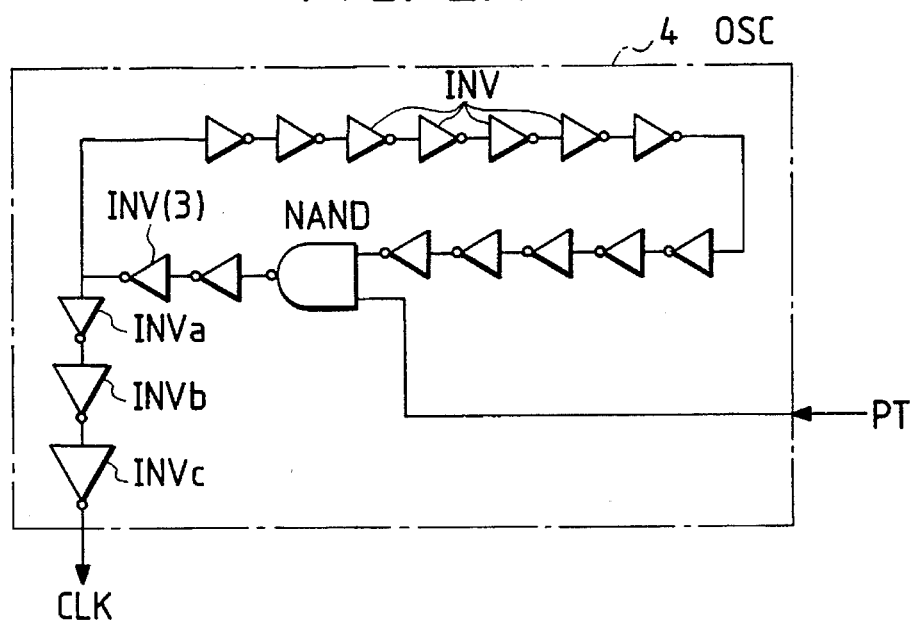
FIG. 2A is a block diagram of an oscillator shown in FIG. 1.

FIG. 2A is a block diagram of the oscillator 4 shown in FIG. 1. The oscillator 4 has a ring oscillator including an odd number (fifteen) of inverting circuits connected in a ring, each outputting an inverting output with a small delay time in response to input signal thereto. More specifically, the ring oscillator comprises fourteen inverters INV and one NAND gate NAND. One input of the NAND gate is supplied with the control pulse PT outputted at the selector 16.

Assuming that the NAND gate NAND is the first stage of the ring oscillator, an output of the third stage of the inverter INV (3) is connected to three output inverters INVa, INVb, and INVc having current drive capacities increased stepwise in order to output the circular pulse in the ring oscillator and to ensure the counting operation in the down counter 6.

Figure 2B:
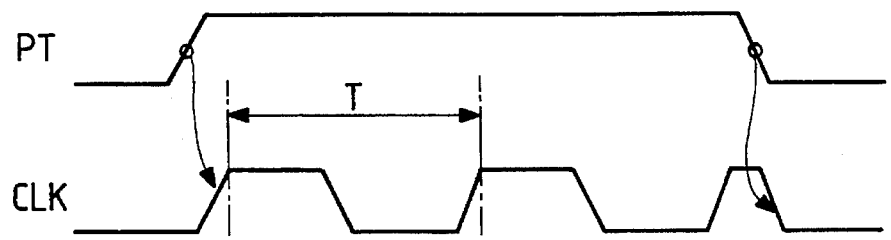
FIG. 2B shows waveforms of the input and output of the oscillator shown in FIG. 1.

FIG. 2B shows waveforms of the input and output of the oscillator shown in FIG. 1. When the control pulse PT of the logic H level is inputted to one input of the NAND gate NAND of the oscillator 4, as shown in FIG. 2B, a pulse signal circulates in the ring oscillator and an oscillation pulse CLK is outputted from the output inverter INVc in phase with the circulation of the pulse signal.

A time interval T of the oscillation pulse CLK (interval between leading edges) is twice the delay time of fifteen stages of the inverting circuits (inverters and NAND gate) of the ring oscillator. That is, it corresponds to thirty stages of the inverting circuits. In this embodiment, the time interval T is set to a delay time of thirty-two stages ($2^5$) of the inverters of the ring oscillator by utilizing loads of the NAND gate NAND and the first stage of the output inverter INVa connected to the ring oscillator.

This setting is provided to easily control the oscillation period or the delay time by the lower five bits of the binary digital control data CDI without a decoder or the like. That is, a delay time of one stage of the inverter INV of the ring oscillator having a minimum delay interval is treated as the minimum unit delay time. In other words, the number of the inverting circuits of the ring oscillator is set with relation to the maximum oscillation frequency of this circuit and an operational speed of the down counter 6. The number of the inverters providing a margin in the operation speed of the down counter 6 is seven, fifteen, thirty-one, or sixty-three.

Figure 4:
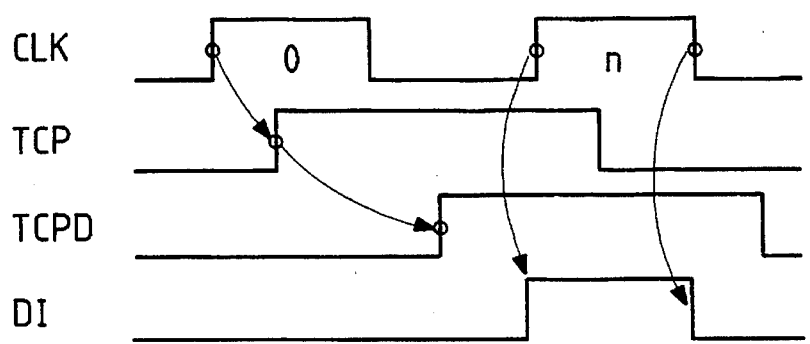
FIG. 4 shows waveforms for explaining the operation of the down counter and the pulse generation circuit shown in FIG. 1.
Figure 3:
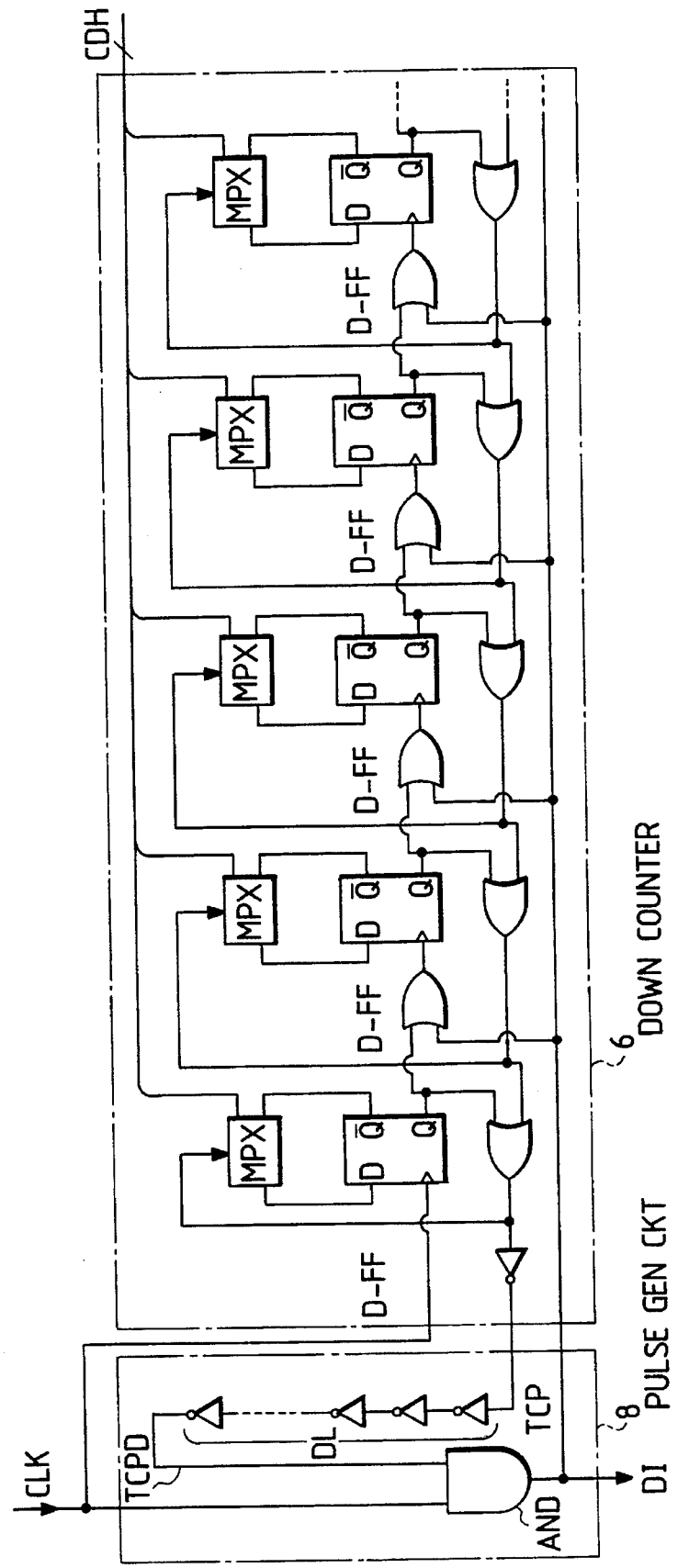
FIG. 3 is a schematic circuit diagram of the down counter and the pulse generation circuit shown in FIG. 1.

FIG. 3 is a schematic circuit diagram of the down counter 6 and the pulse generation circuit shown in FIG. 1. FIG. 4 shows waveforms for explaining the operation of the down counter 6 and the pulse generation circuit 8 shown in FIG. 1. Here, the down counter 6 for effecting down counting in response to the oscillation pulse CLK and the pulse generation circuit 8 correspond to the count means of this invention.

As shown in FIG. 4, an initial count value n is set to the down counter 6 in accordance with the upper bit data CDH of the digital control data CDI and then, the down counter 6 effects down counting in response to the oscillation pulse CLK. When the count value is zero, the down counter 6 generates the detection signal TCP. Each stage of the down counter 6 corresponds to each bit of the upper bit data CDH and comprises a multiplexer MPX and a D flip flop D-FF. The down counter 6 is preset by the first oscillation pulse CLK after outputting the detection signal TCP and starts the counting operation.

The number of stages (D-FF, MPX) of the down counter 6 corresponds to the number of bits of the upper bit data CDH of the digital control data CDI. The oscillation period and the delay time can be made to have a wider range by increasing the number of the stages of the down counter 6 and the number of the upper bit data CDH.

On the other hand, as shown in FIG. 3, the pulse generation circuit 8 comprises a delay line DL, having sixteen inverters connected in series for delaying the detection signal TCP outputted by the down counter 6 for a delay time corresponding to sixteen stages of the inverters and an AND gate for effecting AND operation between the delayed signal TCPD passing through the delay line DL and the oscillation pulse CLK. As shown in FIG. 4, the AND gate outputs the oscillation pulse CLK as the pulse signal DI only when it receives the detection signal TCPD.

Figure 5:
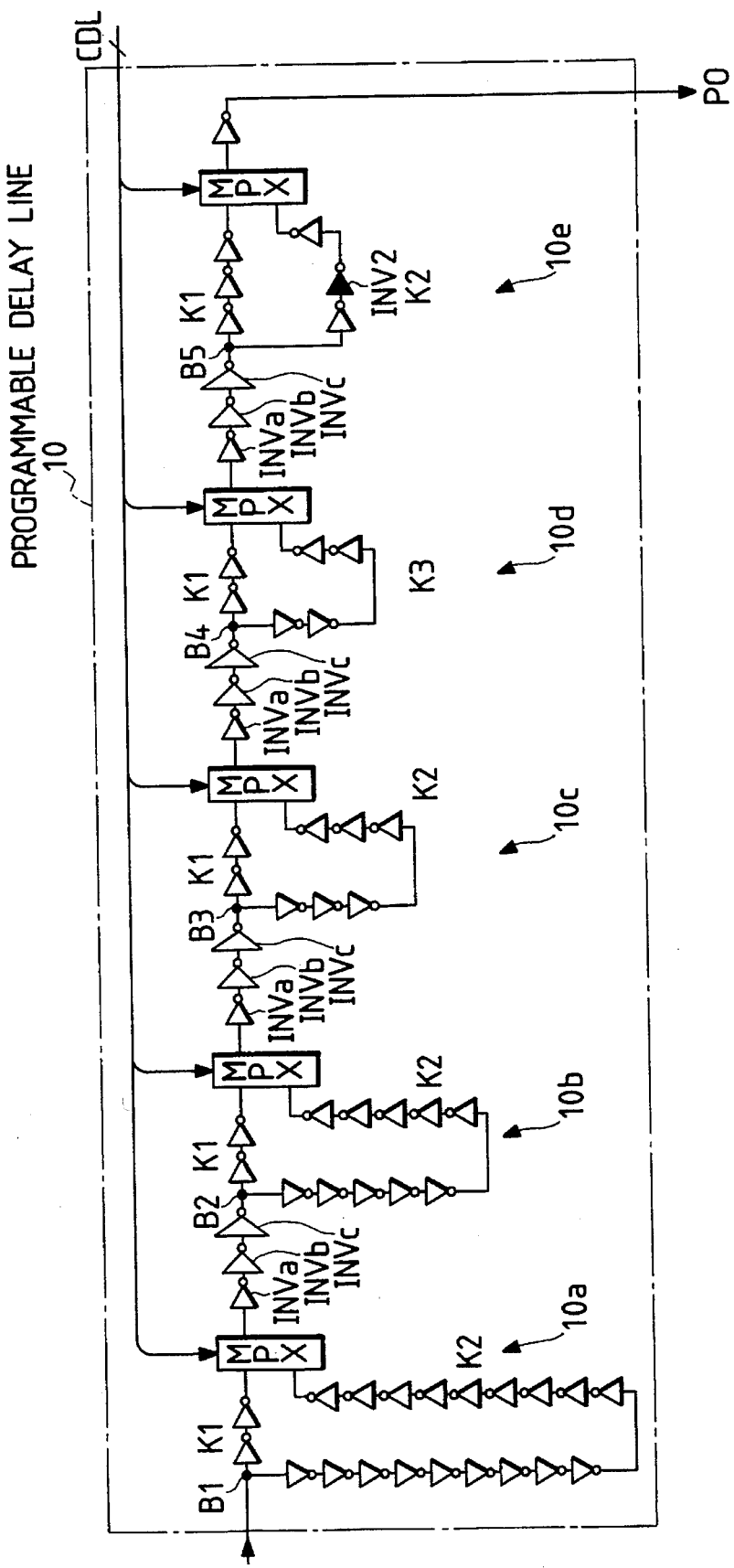
FIG. 5 is a schematic circuit diagram of the programmable delay line shown in FIG. 1.

FIG. 5 is a schematic circuit diagram of the programmable delay line 10 shown in FIG. 1. The programmable delay line 10 comprises five delay stages 10a through 10e connected in series. Each of the delay stages 10a through 10e includes a basic path K1 For passing an input signal thereto and a delay path K2 for passing the input signal with a predetermined delay time with respect to the basic path K1 and a multiplexer MPX for selectively outputting either of outputs of the basic path or the delay path K2.

The first delay stage 10a has two inverters INV in the basic path K1 and eighteen inverters INV in the delay path K2 to make the difference between the times for passing the input signal through the basic path K1 and through the delay path K2 correspond to a half of the interval of the oscillation pulse CLK, namely, the delay time corresponding to sixteen inverters INV.

The second delay stage 10b has two inverters INV in the basic path K1 and ten inverters INV in the delay path K2 to make the difference between the times for passing the input signal through the basic path K1 and through the delay path K2 correspond to one fourth of the interval of the oscillation pulse CLK, namely, the delay time corresponding to eight inverters INV.

The third delay stage 10c has two inverters INV in the basic path K1 and six inverters INV in the delay path K2 to make the difference between the times for passing the input signal through the basic path K1 and through the delay path K2 correspond to one eighth of the interval of the oscillation pulse CLK, namely, the delay time corresponding to four inverters INV.

The fourth delay stage 10d has two inverters INV in the basic path K1 and four inverters INV in the delay path K2 to make the difference between the times for passing the input signal through the basic path K1 and through the delay path K2 correspond to one sixteenth of the interval of the oscillation pulse CLK, namely, the delay time corresponding to two inverters INV.

The fifth delay stage 10e has three inverters INV in the basic path K1 and two inverters INV and one inverter INV2, having a delay time twice that of the inverter INV, in the delay path K2 to make the difference between the times for passing the input signal through the basic path K1 and through the delay path K2 correspond to one thirty-second of the interval of the oscillation pulse CLK, namely, the delay time corresponding to one inverter INV.

That is, in each of the above-mentioned delay stages 10a through 10e, the difference between the times for passing the input signal through the basic path K1 and through the delay path K2 is made to have the delay time of one inverter INV multiplied by $2^n$ (n: 4, 3, 2, 1, and 0) wherein the delay time of one inverter is treated as the minimum difference between the times for passing the input signal through the basic path K1 and through the delay path K2.

Here, though, it is not necessary to provide inverters INV in the basic path K1 if the difference between the times for passing the input signal through the basic path K1 and the delay path K2 is already provided. However, in this embodiment, inverters INV are provided in each of the basic paths K1.

More specifically, inverters INV are provided in each basic path K1 to remove a variation in the delay time, caused by dividing the output line of the inverter INV as opposed to connecting the inverters in series, and to remove a variation in the delay time caused by connecting the output of the inverter INV to the input of the multiplexer MPX.

That is, in the basic path K1, inverters INV are provided on the output sides of the dividing point B1 through B5 and on the sides of the respective multiplexers MPX. Inverters are also provided in the respective delay paths K2. This arrangement allows the difference in the times for passing the input signal through either the basic path K1 or the delay path K2, as selected by the multiplexer MPX, to be equal to the delay time of the intermediate inverters INV, namely, those inverters INV that are neither connected to the dividing points B1 through B5 nor connected to the multiplexer MPX in the delay path K2.

The multiplexer of each of the delay stages 10a through 10e comprises an n-channel p-channel MOS transistor. The multiplexer MPX of the first delay stage 10a is supplied with the highest bit data of the lower bit data CDL. The multiplexer MPX of the second delay stage 10b is supplied with the second highest bit data of the lower bit data CDL. The multiplexer MPX of the third delay stage 10c is supplied with the third highest bit data of the lower bit data CDL. The multiplexer MPX of the fourth delay stage 10d is supplied with the fourth highest bit data of the lower bit data CDL. The multiplexer MPX of the fifth delay stage 10e is supplied with the lowest bit data of the lower bit data CDL.

Each of the multiplexers MPX selects the basic path K1 when the input data thereto is "0" and selects the delay path K2 when the input data thereto is "1".

Therefore, the delay time of this programmable delay line 10 can be changed into thirty-two equi-spaced delay time values in accordance with the lower bit data CDL. One delay time value corresponds to the delay time of one inverter INV which is a unit delay time.

Moreover, in the programmable delay line 10 of this embodiment, in the signal paths from outputs of the multiplexers MPX of the delay stages 10a to 10d to the dividing points B1 to B5 of the next stage of delay stages 10b to 10e respectively there are provided three inverters INVa, INVb, and INVc which are the same as the output inverters in the oscillator 4, that is, their current drive capacities are increased stepwise with an increase of a load developed by the dividing. That is, three inverters INVa, INVb, and INVc are provided.

Therefore, there are five inverters between two consecutive dividing points of the dividing points B1 through B5 of the delay stages 10a to 10e. From the dividing points B1 through B5, rising edges and falling edges exist alternately. Therefore, the difference in the delay time between the rising edge and the falling edge in the multiplexers MPX is cancelled in the whole circuit of the programmable delay line 10.

Further, at the output of the fifth delay stage 10e, there is provided one inverter INV. This inverter INV is provided to supply an output, namely, the delay pulse PO, having the same polarity as the pulse signal DI outputted from the pulse generation circuit 8. Therefore, in this embodiment, provision of one inverter INV at the output of the fifth delay stage 10e makes the number of the inverters through which the input signal (the pulse signal DI) passes an even number, though either of the basic paths K1 or the delay paths K2 is selected.

Moreover, in the fifth delay stage 10e, for the same reason as just described, the number of the inverters INV in the basic path K1 is set to three and the number of the inverters INV in the delay path K2 is also set to three.

That is, when the delay time is controlled by switching the path of the pulse signal DI between the basic path K1 and delay path K2 as mentioned in this embodiment, if the number of the inverters forming the basic path K1 is different from inverters forming the delay path K2, with respect to even or odd, the delay line does not correctly operate because the delay pulse PO shows different polarities on switching of the paths. Therefore, in this embodiment, in the Fifth delay stage 10e, the basic path K1 has the same odd number of inverters as does the delay path K2, namely, three. Therefore, the same polarity of the signal is outputted when either the K1 or the K2 path is selected. Moreover, the difference in times for passing of signals inputted to these paths corresponds to a delay time of one inverter INV.

Moreover, the inverters of the programmable delay line 10 comprise inverters having the same characteristic as the oscillator 4. Thus, an output variation of the oscillator 4 accompanied by a temperature change agrees with an output variation of the programmable delay line 10, so that temperature compensation for the oscillation period and the delay time can be performed easily. This method of compensation will be described later.

Figure 6:
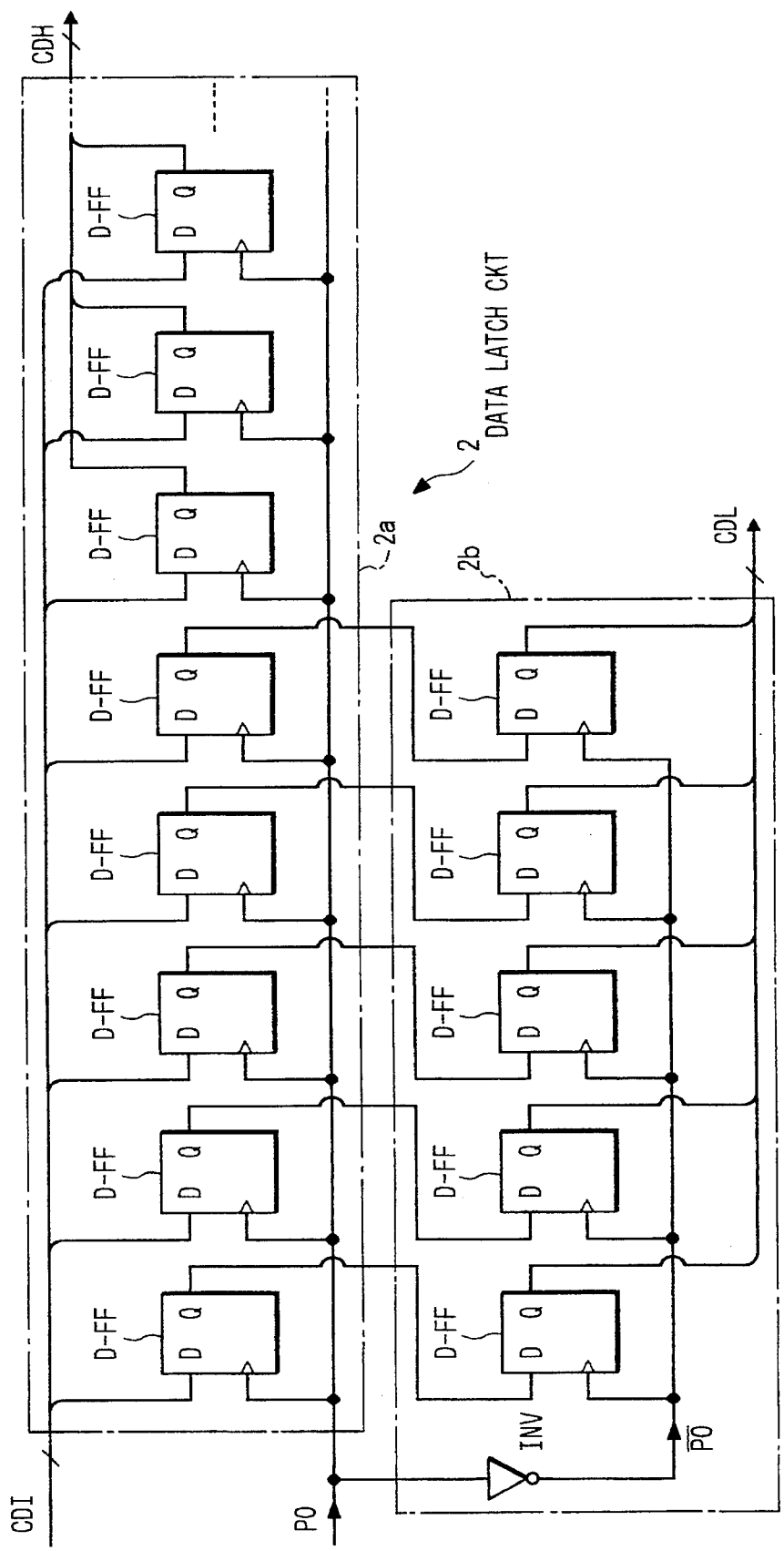
FIG. 6 is a schematic circuit diagram of the data latch circuit shown in FIG. 1.

FIG. 6 is a schematic circuit diagram of the data latch circuit 2 shown in FIG. 1. The data latch circuit 2 comprises a latch circuit 2a and a latch circuit 2b. The latch circuit 2a latches respective bit data of the digital control data CDI at a rising edge of the delay pulse PO outputted from the programmable delay line 10. The latch circuit 2a includes D Flip flops D-FF of which the number corresponds to the number of bits of the digital control data CDI. The latch circuit 2b includes five D flip flops D-FF for latching outputs of the D flip flop D-FF latching the lower five bits of the digital control data CDI in the latch circuit 2a at a falling edge of the delay pulse PO from the programmable delay line 10 through an inverter INV. The latch circuit 2 supplies outputs of the five D flip flops D-FF forming the latch circuit 2b as the lower bit data CDL and outputs of D flip flops D-FF in the latch circuit 2a, except the D flip flops D-FF for lower five bits, as the upper bit data CDH of the digital control data CDI.

Figure 7:
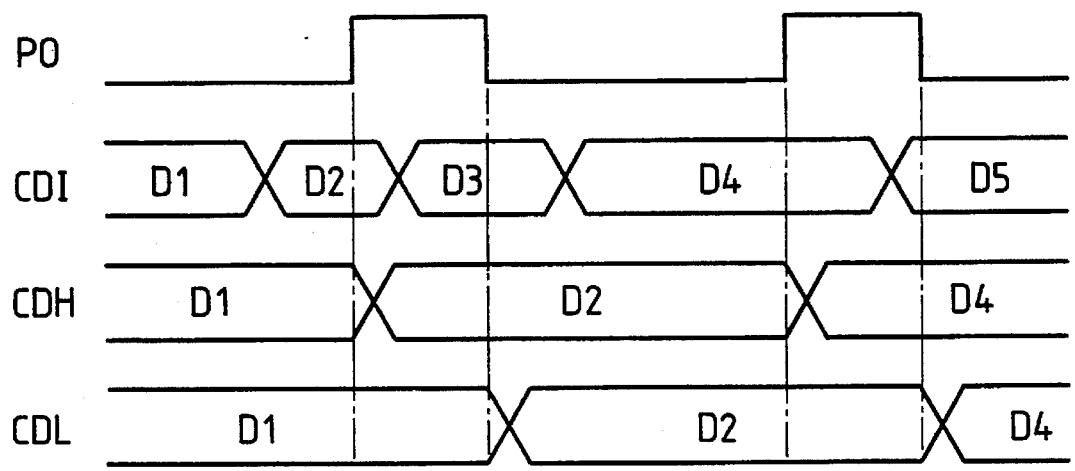
FIG. 7 shows waveforms of inputs and outputs of the data latch circuit shown in FIG. 6.

FIG. 7 shows waveforms at inputs and outputs of the data latch circuit shown in FIG. 6. As shown in FIG. 7, in the data latch circuit 2, the latch circuit 2a latches the digital control data CDI at the rising edge of the delay pulse PO and the latch circuit 2b latches the lower bit data CDL of the digital control data DCI which was latched by lower five bits of the latch circuit 2a at the rising edge of the delay pulse PO, so that respective latch circuits 2a and 2b output the upper bit data CDH and lower bit data CDL of the digital control data.

Figure 8A:
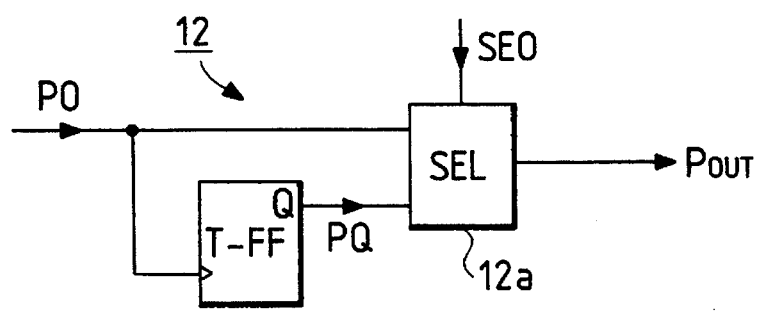
FIG. 8A is a schematic circuit diagram of the output circuit 12 shown in FIG. 1.
Figure 8B:
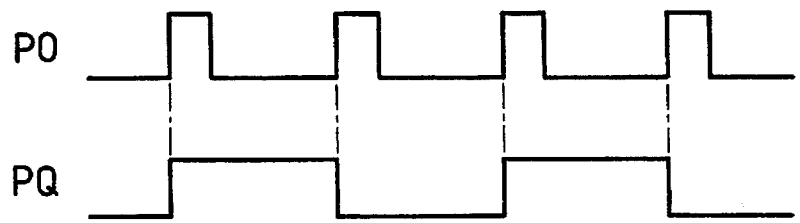
FIG. 8B shows waveforms for explaining the operation of the output circuit shown in FIG. 8A.

FIG. 8A is a schematic circuit diagram of the output circuit 12 shown in FIG. 1. FIG. 8B shows waveforms for explaining the operation of the output circuit shown in FIG. 8A. The output circuit 12 comprises a toggle flip flop T-FF for supplying an output, the level of which, inverts in response to the delay pulse PO from the programmable delay line 10, and a selector 12a comprising a multiplexer for selecting either outputting the delay pulse PO as is or outputting a signal PQ having a pulse duty ratio of 50% as the output of the output circuit.

This arrangement is necessary because, if the delay pulse PO is outputted as is as an output pulse POUT, there is a possibility that the signal would disappear due to rounding at a rising edge thereof because the pulse width of the output pulse POUT would be too small when a circuit load receiving the output pulse POUT is large. That is, in such a case, the minute pulse width of the delay pulse PO would need to be converted into a pulse signal PQ having a wide pulse width.

Moreover, it is also possible to change the pulse width of the pulse signal PQ at will in accordance with the digital control data CDI by changing the digital control data CDI in association with selecting the toggle flip flop T-FF.

Figure 9:
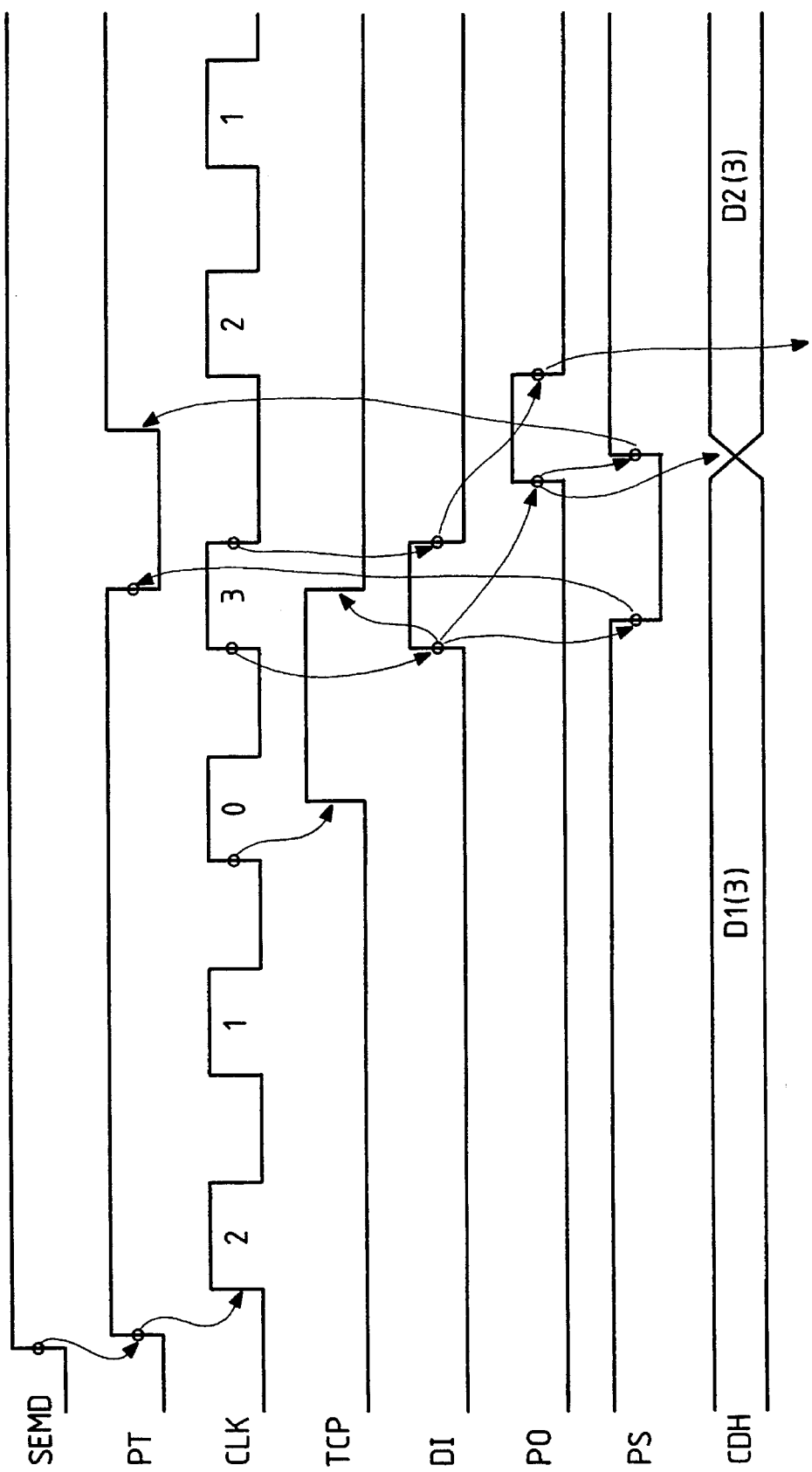
FIG. 9 shows waveforms of respective signals at the digital controlled oscillation apparatus.

Next, the operation of the digital controlled oscillation apparatus of this embodiment having the structure mentioned above will be described. FIG. 9 shows waveforms of respective signals at the digital controlled oscillation apparatus.

As shown in FIG. 9, when the control pulse PT rises from the initial condition (PT=0), the control pulse PT circulates in the ring oscillator of the oscillator 4, so that the oscillation pulse CLK is outputted from the oscillator 4 at the predetermined interval corresponding to thirty-two inverters INV. The down counter 6 effects down counting in response to the oscillation pulse CLK.

For example, if the digital control data CDI of "0001100000" including the upper bit data of "00011" and lower bit data of "00000" is inputted to this apparatus, the down counter 6 outputs the detection signal TCP when three oscillation pulses CLK are inputted from the oscillator 4 because a value "3" is set to the down counter 6. The pulse generation circuit 8 outputs the delay pulse DI in phase with the oscillation pulse CLK outputted from the oscillator 4 next. Moreover, the down counter 6 is preset at an in-phase timing with this pulse signal DI because the down counter 6 is preset by the first oscillation pulse CLK after outputting of the detection signal TCP.

Then, the pulse signal DI is delayed for the predetermined interval by the programmable delay line 10 and outputted as the delay pulse PO. If the lower bit data is "00000" as mentioned above, the basic paths K1 are selected in all delay stages 10a through 10e of the programmable delay line 10, so that the delay time of the programmable delay line 10 is shortest. The delay pulse PO is inputted to the output circuit 12 and outputted externally as the output pulse POUT.

On the other hand, this delay pulse PO is inputted into the feedback circuit 14 also. The feedback circuit 14 is reset by the pulse signal DI outputted from the pulse generation circuit 8 and set by the delay pulse PO outputted from the programmable delay line 10, so that the oscillation operation control signal PS outputted from the feedback circuit 14 turns to a logic L level in phase with the rising edge of the pulse signal DI and turns to a logic H level in phase with the rising edge of the delay pulse PO.

Then, as shown in FIG. 9, when the selection signal SEMD of a logic high level is inputted to the selector 16, the operation mode of this apparatus is selected to be the oscillator mode by the selection signal SEMD. The oscillation operation control signal PS from the feedback circuit 14 is inputted as a control pulse to the oscillator 4, so that the oscillation operation stops while the oscillation operation control signal PS is a logic L level and the oscillator 4 restarts when the same operation mentioned above is executed after the delay pulse PO rises.

As mentioned, according to the digital controlled oscillation apparatus of this embodiment, it is possible to switch the operation mode between the oscillation mode and the delay mode in accordance with the selection signal SEMD inputted externally. That is, the selection signal SEMD selects the mode for operating this apparatus as an oscillation apparatus capable of digitally-controlling the output period of the output pulse POUT or the mode for operating this apparatus as a delay apparatus capable of digitally-controlling an interval (delay time) from the input of the control pulse PT (PI)to the outputting of the output pulse POUT.

Moreover, the output period and the delay time of the output pulse POUT can be changed per a given unit interval, namely, the interval necessary for inverting operation in each stage of inverters INV which provides the time resolution of the programmable delay line 10. Further, the period and the delay time of the output pulse can be controlled over a wide range by changing the number of the oscillation pulse CLK counted by the down counter 6.

For example, assuming that the interval of inverting operation in the inverting circuit (inverter) forming the oscillator 4 and the programmable delay line 10 is about 200 psec, the delay time and oscillation frequency can be controlled with a resolution of about 200 psec over a wide range of delay times, from several nsec to more than several sec, and over a wide range of oscillation frequencies, from tens MHz to more than several Hz.

Figure 10:
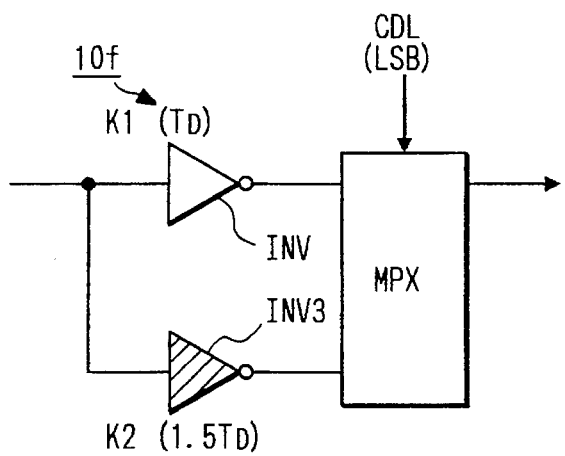
FIG. 10 is a schematic circuit diagram for showing such a modification of this embodiment.

Moreover, in this embodiment, the programmable delay line 10 has the minimum unit of the delay time to be controlled as the delay time of one inverter INV. However, the time resolution can be made smaller. FIG. 10 is a schematic circuit diagram for showing such a modification of this embodiment. As shown in FIG. 10. There is further provided a delay stage 10f in the programmable delay line 10. The sixth delay stage 10f comprises an inverter INV in the basic path k1 and an inverter INV3 having a delay time 1.5 times the delay time TD of the inverter INV in the delay path K2 and a multiplexer MPX supplied with the lowest bit data LSB of the lower bit data CDL. This structure makes the minimum unit delay time of the programmable delay line a half of the delay time TD of the inverter INV. In this case, it is necessary to increase the number of bits of the lower bit data CDL from five to six.

Moreover, according to the digital controlled oscillation apparatus of this embodiment, the oscillation Frequency and the delay time can be set by the digital control data CDI as mentioned above. However, if the operation time of the inverting circuit of the oscillator 4 and the programmable delay line 10 changes, the oscillation frequency and the delay time cannot be controlled accurately because the oscillation frequency and the delay time are essentially determined by the operation time of the inverting circuits forming the oscillator 4 and the programmable delay line 10.

However, in the digital controlled oscillation apparatus of this embodiment, there is further provided a compensation data operation circuit for compensating the oscillating frequency and the delay time simply and surely. That is, the oscillation period and the delay time can be digitally-controlled by: predetermining compensation data in accordance with ratios obtained by comparing the output period of the output pulse POUT from this apparatus with an output period of an output signal of a reference oscillator such as a quartz oscillator or the like. An example of the compensation data operation circuit for determining this compensation data will be described below with reference to FIGS. 11A, 11B, and 12.

Figure 11A:
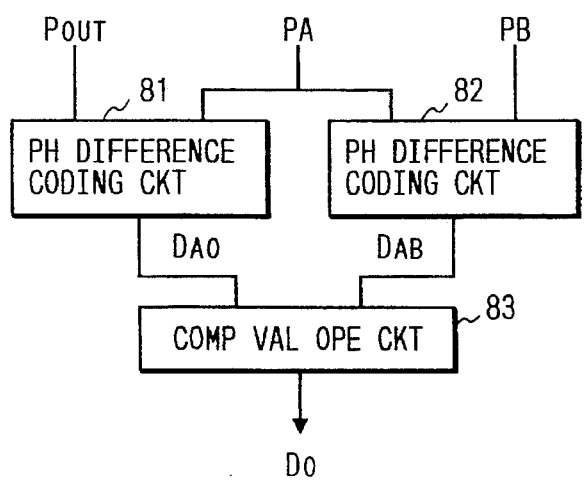
FIG. 11A is a block diagram of the compensation data operation circuit of this embodiment.
Figure 11B:
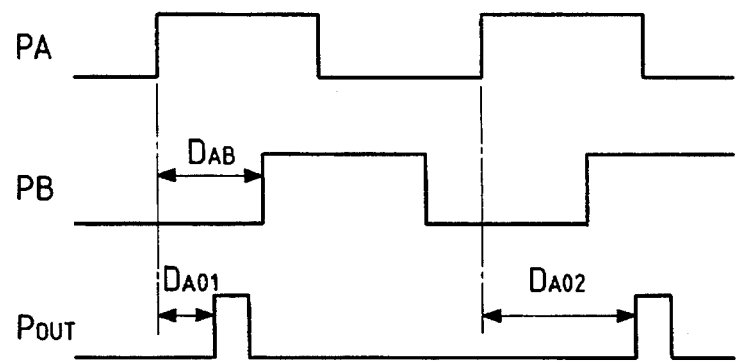
FIG. 11B shows waveforms of the respective signals in the compensation data operation circuit shown in FIG. 11A.
Figure 12:
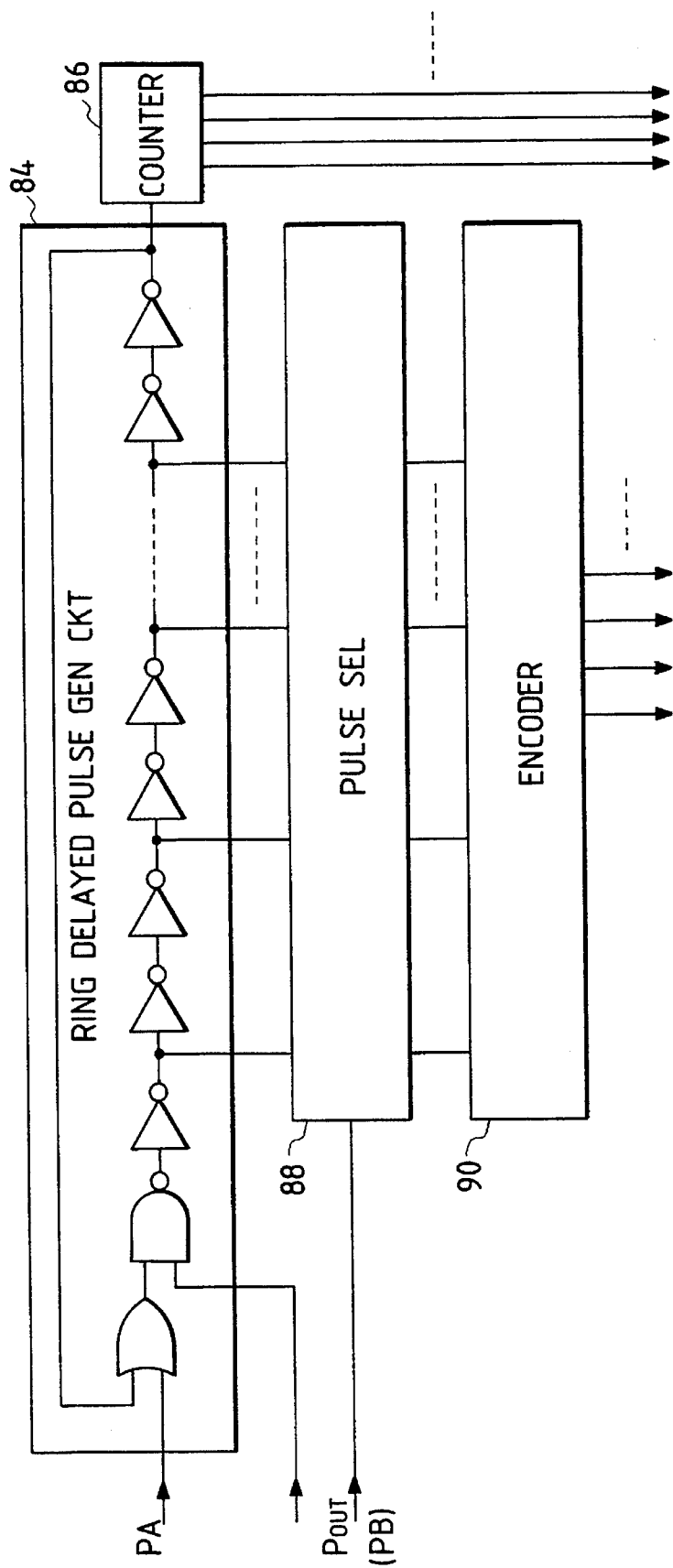
FIG. 12 is a block diagram of a pulse phase difference coding circuit shown in FIG. 11A.

FIG. 11A is a block diagram of the compensation data operation circuit of this embodiment. FIG. 11B shows waveforms of the respective signals in the compensation data operation circuit shown in FIG. 11A. FIG. 12 is a block diagram of pulse phase difference coding circuit shown in FIG. 11A.

As shown in FIG. 11 A, the compensation data operation circuit comprises a First pulse phase difference coding circuit 81 For detecting a phase difference between a reference pulse PA and the pulse POUT, a second pulse phase difference coding circuit 82 for detecting a phase difference between a reference pulse PA and the other input pulse PB, and a compensation value operation circuit 83 for operating compensation data $D_o$ in accordance with the coded data from the phase difference coding circuit 81 and 82.

The first pulse phase difference coding circuit 81 is supplied with a reference pulse PA from a reference oscillator such as a quartz oscillator and the output pulse POUT from the digital controlled oscillation apparatus of the above-mentioned embodiment. The second pulse phase difference coding circuit 82 is supplied with the reference pulse PA from the reference oscillator such as the quartz oscillator or the like and a reference pulse PB obtained by delaying the reference pulse PA for a predetermined interval. Moreover. the output pulse POUT inputted to the pulse phase difference coding circuit 81 is a signal obtained when the digital controlled oscillation apparatus is operated as the oscillator with the digital data CDI inputted to make the oscillation period equal to that of the reference pulse PA.

Each of the above-mentioned pulse phase difference coding circuits 81 and 82 comprises a ring delay pulse generation circuit 84 having an OR gate, a NAND gate, an even number of inverters which are connected in a ring, a counter 86, a pulse selector 88, and an encoder 90 as shown in FIG. 12. These pulse phase difference coding circuits 81 and 82 were proposed by the applicant of this invention in Japanese patent application No. 2-15865, etc. and operate as follows:

In each of the above-mentioned pulse phase difference coding circuits 81 and 82, a reference pulse PA is supplied to an input of the OR gate of the ring delayed pulse generation circuit 84. Then, at intermediate points of the ring delay pulse generation circuit 84, a plurality of delayed pulses are outputted and supplied to the pulse selector 88. The delayed pulses determine a delay time by the number of stages of the inverter through which the reference pulse PA passes. The pulse selector 88 is supplied with the other input pulse POUT or PB. 0n receiving of this pulse POUT or PB, the pulse selector 88 selects only inputs coming from stages of the ring delay pulse generation circuit 84 where the reference pulse PA reaches and supplies a signal corresponding to the selected inputs to the encoder 90. The encoder 90 outputs a binary digital signal corresponding to inputs thereto. Because the last stage of the inverter output of the ring delayed pulse generation circuit 84 is connected to the OR gate, the reference pulse PA returns to the OR gate with a delay time generated by all circuits forming the ring. As a result, the reference pulse PA circulates in the ring delayed pulse generation circuit 84. The counter 86 is connected to an output of the inverter's last stage and outputs the count result as the upper bits against an output of the encoder 90.

Accordingly, as shown in FIG. 11B, outputs of the pulse phase difference coding circuits 81 and 82 mentioned above provide time differences between the pulses PA and POUT or pulses PA and PB as digital values DAO or DAB. The structure and operation of the above-mentioned pulse phase difference coding circuits 81 and 82 are disclosed in Japanese patent application No. 2-15865, etc. in detail. Thus, a more detailed description is omitted.

As mentioned, the pulse phase difference coding circuit 81 provides the digital value DAO indicative of the time difference between the output pulse POUT from the digital controlled oscillation apparatus and the reference pulse PA from the reference oscillator such as a quartz oscillator. The pulse phase difference coding circuit 82 provides the digital value DAB indicative of the time difference between the reference pulse PA and the reference pulse PB. Since the digital value DAB out of the digital values DAB and DAO obtained as mentioned represents a time difference between input timings of the reference pulses PA and PB having the same period and the time difference is known, the obtained digital value DAB can be used as a reference time data. On the other hand, the digital value DAO simply represents a time difference between a rising edge of the reference pulse PA and the output pulse POUT, so that it is impossible to obtain a deviation of periods between the reference pulse PA and the output pulse POUT from this digital value DAO.

The compensation value operation circuit 83 initially obtains a digital value $\Delta DAO$ (=DAO2 − DAO1) corresponding to a time difference in period between the reference pulse PA and the output pulse POUT by determining a difference between digital values DAO1, and DAO2, which are consecutively obtained twice by the pulse phase difference coding circuit 81. Here, the digital value $\Delta DAO$ shows that the period of the output pulse POUT is longer than the reference pulse PA when the digital value $\Delta DAO$ is positive and that the period of the output pulse POUT is shorter than the reference pulse PA when $\Delta DAO$ is negative.

Next, time difference data TAO (=TAB. $\Delta DAO/DAB$) accurately representing a time difference of the output pulse POUT and the reference pulse PA is obtained with this digital value $\Delta DAO$, the digital value DAB, and the known time TAB represented by the above-mentioned digital value DAB. The time difference data TAO is added to a reference oscillation period TA of the reference pulse PA to obtain an actual oscillation period TO (=TA+TAO) of the output pulse POUT. Compensation data $D_o$ (=TA/TO) is obtained by subtracting the reference oscillation period TA by the oscillation period TO.

For example, when the digital controlled oscillation apparatus is operated with an oscillation period of 1000 nsec, which is controlled by the digital data CDI, to obtain the compensation data with a reference oscillator having an oscillation frequency 1 MHz (oscillation period: 1000 nsec) and an actual oscillation period of 800 nsec, the time difference data TAO is −200 nsec. The oscillation period TO is 800 nsec which is obtained from the value TAO and the reference oscillation period TA (=1000 nsec). Accordingly, 1.25 (1000/800) is obtained as the compensation data Do.

After this operation, when the above-mentioned digital controlled oscillation apparatus is operated, a value CCDI (=Do.CDI) obtained by compensating the digital data CDI by the compensation data Do is inputted to the data latch circuit 2. Therefore, the digital controlled oscillation apparatus generates the output pulse POUT with the oscillation period corresponding to a digital data CDI.

Moreover, the digital controlled oscillation apparatus of this embodiment is applicable to a high frequency PLL used in a communication apparatus or a motor control apparatus or the like because this digital controlled oscillation apparatus can digitally-control its oscillation frequency up to a high frequency region on the order of 10 MHz by the digital control data DCI inputted to the data latch circuit 2. FIG. 13A shows an example of this application of the digital controlled oscillation apparatus of this embodiment. In FIG. 13A, a high frequency digital PLL without an A/D converter or the like can be structured as follows:

The digital controlled oscillation apparatus of the above-mentioned embodiment is used for a variable frequency oscillator 92 and the pulse phase difference coding circuit as shown in FIG. 12 is used for a phase comparator 94. The known digital filter is used for a loop filter 96.

FIG. 13B is a time chart for showing an operation of this example of the digital PLL.

A phase difference between the output pulse POUT from the variable frequency oscillator 92 and an externally inputted reference pulse PC is obtained by the phase comparator 94 as a digital value DA. The digital value DA is converted into a digital value DB by the loop filter 96 and the converted value is inputted to the variable oscillator 92. As a result, the output pulse POUT is controlled by the reference pulse PC.

Since the variation in the inverting interval of the inverting circuits forming the oscillator 4 and the programmable delay line 10 is automatically compensated in such a PLL (because of feedback), it is unnecessary to compensate the digital control data.

What is claimed is:

1. A programmable delay line comprising a plurality of delay stages connected in series, each of said delay stages including:

a basic path for passing an input signal;

a delay path for passing said input signal with a predetermined delay time; and a selector for selecting either of said basic path or said delay path to pass said input signal in accordance with digital data externally inputted, wherein a difference in the times for passing said input signal through said basic path and through said delay path in each of said plurality of delay stages is $UD.2^n$ (n=0, 1, 2, 3 . . . ), said UD being a possible minimum time difference between passing of said input signal through said basic path and through said delay path in each of said plurality of delay stages and said n being the number of the respective one of said delay stages, wherein at least said delay path comprises a delay means for providing said difference, wherein said delay means comprises one or more inverting circuits, and wherein said basic path in the last of said delay stages comprises three first inverting circuits having the same inverting interval and said delay path in the last of said delay stages comprises two of said first inverting circuits and a second inverting circuit having a delay time twice that of said first inverting circuit.

2. A programmable delay line as claimed in claim 1, wherein said possible minimum time difference is equal to a time interval necessary for inverting a circuit condition of each of said inverting circuits.

3. A programmable delay line as claimed in claim 1, wherein each of said basic paths from the first of said delay stages to one of said delay stages just prior to the last of said delay stages comprises two said inverting circuits and each of said delay paths from the first of said delay stages to one of said delay stages just prior to the last of said delay stages comprises ($2+2_n$) of said inverting circuits.

4. A programmable delay line as claimed in claim 1, wherein each of said basic paths from the first of said delay stages to one of said delay stages just prior to the last of said delay stages comprises two of said inverting circuits and each of said delay paths from the first of said delay stages to said one of said delay stage just prior to the last of said delay stages comprises ($2+2_n$) of said inverting circuits and wherein said basic path in the last of said delay stages comprises three first inverting circuits having the same inverting interval and said delay path in the last of said delay stages comprises two of said first inverting circuits and a second inverting circuit having a delay time twice that of said first inverting circuit.

5. A programmable delay line as claimed in claim 1, further comprising an inverting circuit provided to an output of the last of said delay stages.

6. A programmable delay line as claimed in claim 1, further comprising signal paths for connecting two consecutive delay stages, each of said signal paths comprising an odd number of inverting circuits.

7. A programmable delay line as claimed in claim 6, wherein said inverting circuits have current drive capacities increased stepwise from the first of said odd number of said inverting circuits.

8. A programmable delay apparatus comprising:

an oscillator responsive to an input signal for generating oscillation pulses at a predetermined interval;

means for counting said oscillation pulses and generating a detection signal delayed a first interval from said input signal when a count value of said counting means reaches a predetermined value;

a programmable delay line for delaying said detection signal for a second interval less than said predetermined interval to produce an output signal delayed by an amount corresponding to said first interval and said second interval from said input signal, said programmable delay line comprising a plurality of delay stages connected in series, each of said delay stages including:

a basic path for passing an input signal;

a delay path for passing said input signal with a predetermined delay time; and a selector for selecting either of said basic path or said delay path to pass said input signal in accordance with digital data externally inputted, wherein a difference in the times for passing said input signal through said basic path and through said delay path in each of said plurality of delay stages is $UD.2^n$ ($n=0, 1, 2, 3 \ldots$), said UD being a possible minimum time difference between passing of said input signal through said basic path and through said delay path in each of said plurality of delay stages and said n being the number of the respective one of said delay stages, wherein at least said delay path comprises a delay means for providing said difference, wherein said delay means comprises one or more inverting circuits, and wherein said basic path in the last of said delay stages comprises three first inverting circuits having the same inverting interval and said delay path in the last of said delay stages comprises two of said first inverting circuits and a second inverting circuit having a delay time twice that of said first inverting circuit; and control data supplying means, receiving digital control data having a predetermined number of bits indicative of a desired time for delaying said output signal from said input signal, for supplying upper bits of said digital control data to said counting means as said predetermined value, and for supplying lower bits of said digital control data to said programmable delay line as said digital data.

9. A programmable delay apparatus as claimed in claim 8, wherein said oscillator comprises a ring oscillator having an odd number of inverting circuits connected in a ring.

10. A programmable delay apparatus as claimed in claim 8, wherein said programmable delay line comprises inverting circuits for delaying said pulse signal with an interval necessary for inverting a circuit condition of said inverting circuit.

11. A programmable delay apparatus as claimed in claim 9, wherein said programmable delay line comprises inverting circuits for delaying said pulse signal with an interval necessary for inverting a circuit condition of said inverting circuit.

12. A programmable delay apparatus comprising:

an oscillator responsive to an input signal for generating oscillation pulses at a predetermined interval, wherein said oscillator comprises a ring oscillator having an odd number of inverting circuits connected in a ring and wherein one of said inverting circuits comprises a starting up circuit responsive to a control signal for starting oscillation of said ring oscillator;

means for counting said oscillation pulses and generating a detection signal delayed a first interval from said input signal when a count value of said counting means reaches a predetermined value;

a programmable delay line for delaying said detection signal for a second interval less than said predetermined interval to produce an output signal delayed by an amount corresponding to said first interval and said second interval from said input signal, said programmable delay line comprising a plurality of delay stages connected in series, each of said delay stages including:

a basic path for passing an input signal;

a delay path for passing said input signal with a predetermined delay time; and a selector for selecting either of said basic path or said delay path to pass said input signal in accordance with digital data externally inputted, wherein a difference in the times for passing said input signal through said basic path and through said delay path in each of said plurality of delay stages is $UD.2^n$ ($n=0, 1, 2, 3 \ldots$), said UD being a possible minimum time difference between passing of said input signal through said basic path and through said delay path in each of said plurality of delay stages and said n being the number of the respective one of said delay stages, wherein at least said delay path comprises a delay means for providing said difference, wherein said delay means comprises one or more inverting circuits, and wherein said basic path in the last of said delay stages comprises three first inverting circuits having the same inverting interval and said delay path in the last of said delay stages comprises two of said first inverting circuits and a second inverting circuit having a delay time twice that of said first inverting circuit; and control data supplying means, receiving digital control data having a predetermined number of bits indicative of a desired time for delaying said output signal from said input signal, for supplying upper bits of said digital control data to said counting means as said predetermined value, and for supplying lower bits of said digital control data to said programmable delay line as said digital data.

13. A programmable delay apparatus as claimed in claim 12, further comprising an odd number of inverting circuits connected in series provided between said ring oscillator having current drive capacities increased stepwise in the direction of a signal passing there.

14. A programmable delay apparatus as claimed in claim 12, wherein an interval of oscillation pulses outputted by said oscillator is $2^n$ ($n=0, 1, 2, 3 \ldots$) times an inverting interval necessary for inverting of the circuit condition of said odd number of inverting circuits.

15. A programmable delay apparatus as claimed in claim 13, wherein said programmable delay line and said oscillator comprises inverting circuits having the same characteristics.

16. An digital controlled oscillation apparatus comprising:

an oscillator for generating oscillation pulses at a predetermined interval;

means for counting said oscillation pulses and generating a detection signal when a count value thereof reaches a predetermined value;

a programmable delay line for delaying said detection signal for an interval less than said predetermined interval, said interval being controlled by digital data;

control data supplying means for receiving a digital control data having a predetermined number of bits indicative of oscillation period of said digital controlled oscillation apparatus, for supplying upper bits of said digital control data to said counting means as said predetermined value, and for supplying lower bits of said digital control data to said programmable delay line as said digital data; and a feedback circuit for stopping an oscillation condition of said oscillator in response to said detection signal and for starting said oscillator when said delay pulse is outputted from said programmable delay line.

17. An digital controlled oscillation apparatus as claimed in claim 16, further comprising: a reference oscillator for generating pulses at a predetermined period; and a compensation circuit for compensating said delayed detection pulse outputted from said programmable delay line such that a period of said delayed detection pulse agrees with a period of pulses outputted from said reference oscillator.

* * * * *